United States Patent
Manipatruni et al.

(10) Patent No.: US 10,333,523 B2
(45) Date of Patent: Jun. 25, 2019

(54) EXCLUSIVE-OR LOGIC DEVICE WITH SPIN ORBIT TORQUE EFFECT

(71) Applicant: Intel Corporation, Santa Clara, CA (US)

(72) Inventors: Sasikanth Manipatruni, Hillsboro, OR (US); Dmitri Nikonov, Beaverton, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/567,945

(22) PCT Filed: May 28, 2015

(86) PCT No.: PCT/US2015/032942
§ 371 (c)(1),
(2) Date: Oct. 19, 2017

(87) PCT Pub. No.: WO2016/190879
PCT Pub. Date: Dec. 1, 2016

(65) Prior Publication Data
US 2018/0145691 A1 May 24, 2018

(51) Int. Cl.
*H03K 19/21* (2006.01)
*H01L 43/08* (2006.01)
*H03K 19/18* (2006.01)
*H01L 43/04* (2006.01)

(52) U.S. Cl.
CPC .............. *H03K 19/21* (2013.01); *H01L 43/04* (2013.01); *H01L 43/08* (2013.01); *H03K 19/18* (2013.01)

(58) Field of Classification Search
CPC .......... H01L 43/04; H01L 43/08; H03K 19/18; H03K 19/21
See application file for complete search history.

(56) References Cited

U.S. PATENT DOCUMENTS 7,439,770 B2 * 10/2008 Kim ..................... G11C 11/16
326/134
9,230,626 B2 * 1/2016 Buhrman ............... G11C 11/18
9,251,883 B2 * 2/2016 Wu ..................... G11C 11/1693
(Continued)

FOREIGN PATENT DOCUMENTS

WO 2009104851 8/2009

OTHER PUBLICATIONS

International Search Report and Written Opinion for International Patent Application No. PCT/US2015/032942, dated Feb. 26, 2016.
(Continued)

*Primary Examiner* — Alexander H Taningco
*Assistant Examiner* — Kurtis R Bahr
(74) *Attorney, Agent, or Firm* — Green, Howard & Mughal LLP

(57) ABSTRACT

Described is an apparatus which comprises: a first layer formed of a material that exhibits spin orbit torque effect; a second layer formed of material that exhibits spin orbit torque effect; and a magnetic tunneling junction (MTJ) including first and second free magnetic layers, wherein the first free magnetic layer is coupled to the first layer and wherein the second free magnetic layer is coupled to the second layer.

17 Claims, 11 Drawing Sheets

(56) References Cited

U.S. PATENT DOCUMENTS

| | | | |
|---|---|---|---|
| 9,818,465 B2* | 11/2017 | Bandiera | H01F 10/3254 |
| 2010/0134923 A1* | 6/2010 | Clinton | G11C 11/161 |
| | | | 360/131 |
| 2010/0315863 A1 | 12/2010 | Zhu et al. | |
| 2011/0069536 A1* | 3/2011 | Lou | G11C 11/1675 |
| | | | 365/158 |
| 2013/0215672 A1* | 8/2013 | Zhou | G11C 11/161 |
| | | | 365/158 |
| 2013/0215673 A1* | 8/2013 | Zhou | G11C 11/161 |
| | | | 365/158 |
| 2013/0230741 A1* | 9/2013 | Wang | G11B 5/82 |
| | | | 428/826 |
| 2014/0169083 A1* | 6/2014 | Wang | G11C 11/161 |
| | | | 365/158 |
| 2014/0169088 A1* | 6/2014 | Buhrman | G11C 11/18 |
| | | | 365/158 |
| 2014/0264513 A1* | 9/2014 | De Brosse | H01L 43/065 |
| | | | 257/295 |
| 2015/0129995 A1* | 5/2015 | Wang | G11C 11/18 |
| | | | 257/421 |
| 2015/0131179 A1* | 5/2015 | Braganca | G11B 5/3143 |
| | | | 360/75 |
| 2015/0200003 A1* | 7/2015 | Buhrman | G11C 11/18 |
| | | | 365/158 |
| 2016/0225424 A1* | 8/2016 | Qiu | H01F 10/329 |

OTHER PUBLICATIONS

International Preliminary Report on Patentability from PCT/US2015/032942 dated Dec. 7, 2017, 7 pgs.
Partial Supplementary European Search Report from European Patent Application No. 15893517.1 dated Dec. 4, 2018, 15 pgs.
Extended European Search Report from European Patent Application No. 15893517.1 dated Apr. 1, 2019, 13 pgs.

* cited by examiner

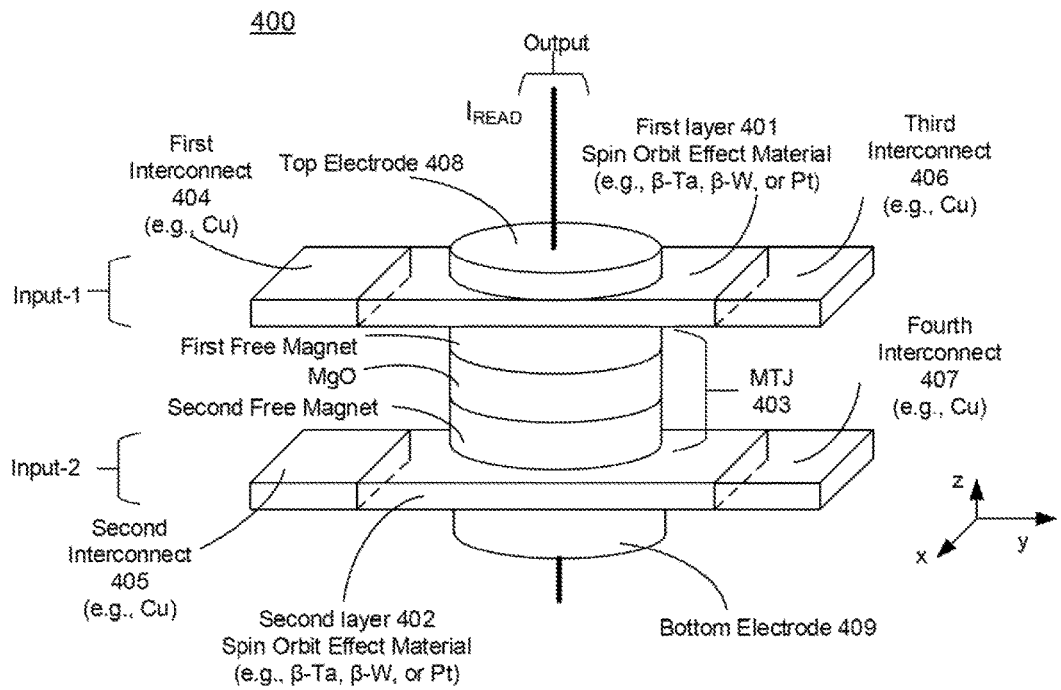
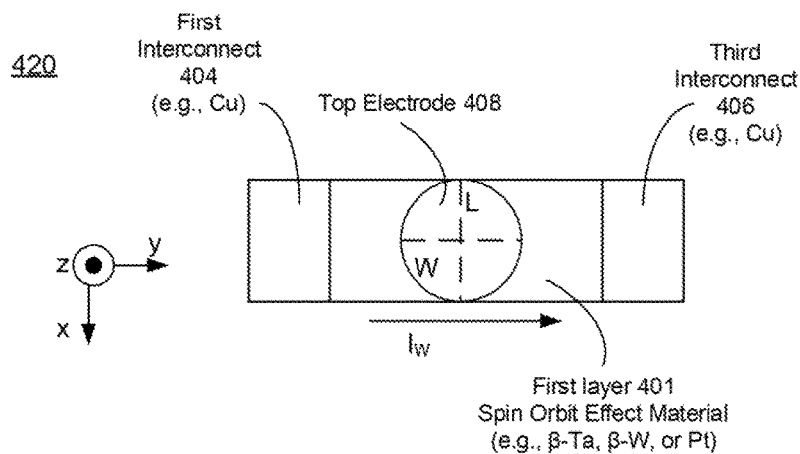
Fig. 4A
Fig. 4B

— EXCLUSIVE-OR LOGIC DEVICE WITH SPIN ORBIT TORQUE EFFECT

CLAIM OF PRIORITY

This Application is a National Stage Entry of, and claims priority to, PCT Application No. PCT/US15/32942, filed on 28May 2015and titled "EXCLUSIVE-OR LOGIC DEVICE WITH SPIN ORBIT TORQUE EFFECT," which is incorporated by reference in its entirety for all purposes.

BACKGROUND

Exclusive-OR (XOR) logic function is widely used in processors and memories. For example, XOR logic functions are used for comparing digital data for image processing, security operations, pattern recognition, error correction in memories, etc. XOR logic functions can be implemented using NAND and NOR logic gates as shown by logic gates 100 of FIG. 1 and 200 of FIG. 2, respectively. However, typical NAND and NOR logic gates are volatile logic gates that lose their output values when power is turned off to the NAND and NOR logic gates.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 4A illustrates a non-volatile 1-bit XOR logic formed with interconnects coupled to electrodes formed of spin orbit effect (SOE) materials and a MTJ coupled between the electrodes, according to some embodiments of the disclosure.

FIG. 4B illustrates a top view of the non-volatile 1-bit XOR logic of FIG. 4A, according to some embodiments of the disclosure.

DETAILED DESCRIPTION

In some embodiments, an exclusive-OR (XOR) logic is provided which comprises a dual free ferromagnetic layer Magnetic Tunneling Junction (MTJ) with input electrodes formed of Spin Orbit Effect (SOE) material. In some embodiments, the input electrodes are coupled to the free ferromagnetic layers of the MTJ. In some embodiments, the inputs to the XOR logic are charge currents flowing in interconnects coupled to the input electrodes. In some embodiments, the SOE in the input electrodes leads to spin current injection into the free magnetic layers of the MTJ leading to XOR logic state calculation.

Figure 1:
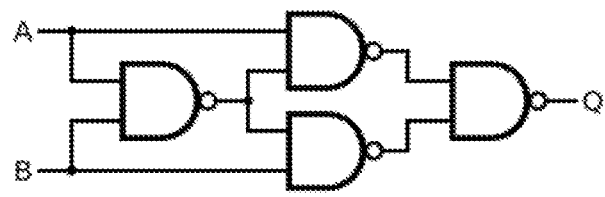
FIG. 1 illustrates a typical XOR logic gate implemented using NAND logic gates.
Figure 2:
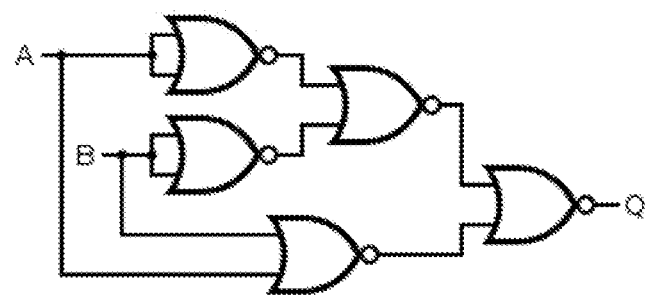
FIG. 2 illustrates a typical XOR logic gate implemented using NOR logic gates.

There are many technical effects of various embodiments. For example, an XOR logic with non-volatility is provided which is smaller in size than traditional multi-gate based XOR logic gates. This non-volatile XOR logic enables comparison of a fixed programmable key with the output of the XOR logic. The non-volatile XOR logic can be used for implementing comparators with bits stored in the free ferromagnetic layers coupled to the electrodes formed of SOE material. Such bits can be used to enable encryption and pattern matching, for example. In some examples, the footprint (i.e., layout pitch) of the non-volatile XOR logic is smaller than the complementary metal oxide semiconductor transistors (CMOS) based XOR logic gates 100 and 200 illustrated with reference to FIGS. 1-2, respectively. The non-volatile XOR logic with intrinsic stochastic nature can be used in pseudorandom number generation using shift registers. Other non-limiting technical effects will be evident from various embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct physical, electrical, or wireless connection between the things that are connected, without any intermediary devices. The term "coupled" means either a direct electrical or wireless connection between the things that are connected or an indirect electrical or wireless connection through one or more passive or active intermediary devices. The term "circuit" means one or more passive and/or active components that are arranged to cooperate with one another to provide a desired function. The term "signal" means at least one current signal, voltage signal, magnetic signal, electromagnetic signal, or data/clock signal. The meaning of "a," "an," and "the" include plural references. The meaning of "in" includes "in" and "on."

The terms "substantially," "close," "approximately," "near," and "about," generally refer to being within +/−20% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits and logic blocks described here are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors-BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 3A:
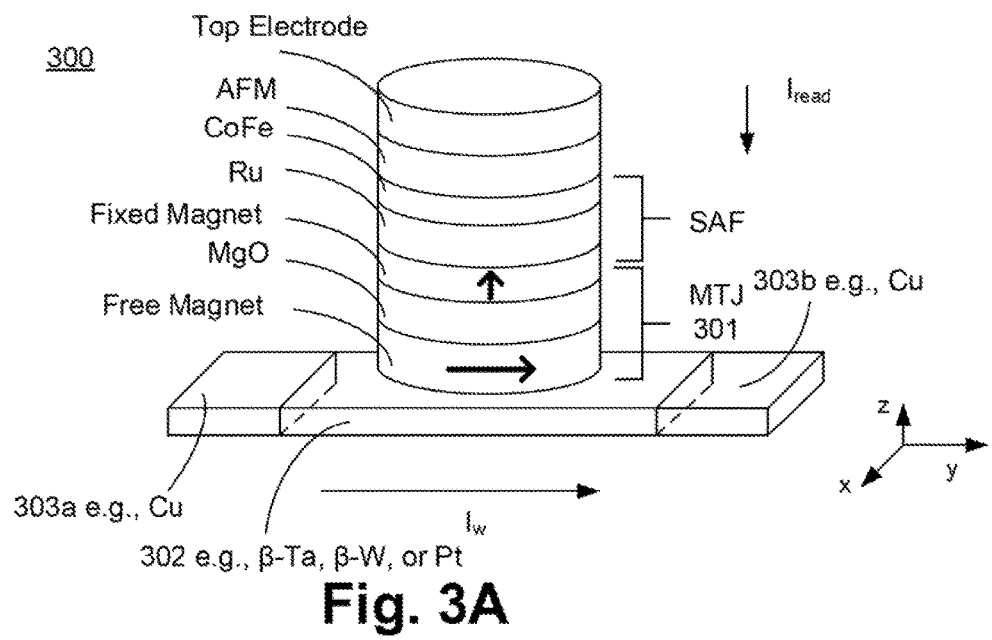
FIG. 3A illustrates a stack of layers having a magnetic tunneling junction (MTJ) coupled to a spin orbit effect material.

FIG. 3A illustrates stack 300 of layers having a MTJ coupled to an electrode formed of SOE material. Stack 300 forms a three terminal memory cell with SOE induced write mechanism and MTJ based read-out. FIG. 3A describes the operating mechanism of SOE switching (e.g., Giant Spin Hall Effect Spin Torque Switching) which is used in forming non-volatile XOR logic as described with reference to FIGS. 4-12, according to some embodiments.

Referring back to FIG. 3A, stack 300 comprises MTJ 301, SOE Interconnect or electrode 302, and non-magnetic metal (s) 303a/b. In one example, MTJ 301 comprises a spin valve which is formed by stacking a ferromagnetic layer with a tunneling dielectric and another ferromagnetic layer. One or both ends along the horizontal direction of SOE Interconnect 302 is formed of non-magnetic metals 303a/b.

A wide combination of materials can be used for material stacking of MTJ 301. In some embodiments, the stack of materials include: $Co_xFe_yB_z$, MgO, $Co_xFe_yB_z$, Ru, $Co_xFe_yB_z$, IrMn, Ru, Ta, and Ru, where 'x,' 'y,' and 'z' are fractions of elements in the alloys. In other embodiments, other materials may be used to form MTJ 301. In some embodiments, MTJ 301 stack comprises free magnetic layer, MgO tunneling oxide, a fixed magnetic layer which is a combination of CoFe/Ru/CoFe layers referred to as Synthetic Anti-Ferro-magnet (SAF)-based, and Anti-Ferromagnet (AFM) layer. The SAF layer has the property, that the magnetizations in the two CoFe layers are opposite, and allows for cancelling the dipole fields around the free magnetic layer such that a stray dipole field will not control the free magnetic layer.

Various embodiments here are described with reference to SOE Interconnect 302 being a Spin Hall Effect (SHE) material Interconnect. However, the embodiments can also use Interconnect formed with other SOE materials. In some embodiments, SOE Interconnect 302 is a metal interconnect that exhibits SOE properties. In some embodiments, the SOE Interconnect can be connected to other SOE Interconnects with conventional non-magnetic conductors, such as copper Cu. One such example is shown with reference to FIG. 8.

Referring back to FIG. 3A, in some embodiments, SOE Interconnect 302 (or the write electrode) is made of one or more of β-Tantalum (β-Ta), Ta, β-Tungsten (β-W), W, Pt, Copper (Cu) doped with elements such as Iridium, Bismuth and any of the elements of 3d, 4d, 5d and 4f, 5f periodic groups in the Periodic Table which may exhibit high spin orbit coupling. In some embodiments, SOE Interconnect 302 transitions into high conductivity non-magnetic metal(s) 303a/b to reduce the resistance of SOE Interconnect 302. In some embodiments, the non-magnetic metal(s) 303a/b are formed from one or more of: Cu, Co, α-Ta, Al, CuSi, or NiSi.

In one embodiment, the magnetization direction of the fixed magnetic layer is perpendicular relative to the magnetization direction of the free magnetic layer (i.e., magnetization directions of the free and fixed magnetic layers are not parallel, rather they are orthogonal). For example, magnetization direction of the free magnetic layer is in-plane while the magnetization direction of the fixed magnetic layer is perpendicular to the in-plane. In one embodiment, magnetization direction of the fixed magnetic layer is in-plane while the magnetization direction of the free magnetic layer is perpendicular to the in-plane.

In one embodiment, the thickness of the fixed magnetic layer determines its magnetization direction. For example, when the thickness of the fixed magnetic layer is above a certain threshold (depending on the material of the magnet, e.g. approximately 1.5 nm for CoFe), then the fixed magnetic layer exhibits magnetization direction which is in-plane. Likewise, when the thickness of the fixed magnetic layer is below a certain threshold (depending on the material of the magnet), then the fixed magnetic layer exhibits magnetization direction which is perpendicular to the plane of the magnetic layer. In one embodiment, the thickness of the free magnetic layer also determines its magnetization direction in the same manner as in the thickness of the fixed magnetic layer.

Other factors may also determine the direction of magnetization. For example, factors such as surface anisotropy (depending on the adjacent layers or a multi-layer composition of the ferromagnetic layer) and/or crystalline anisotropy (depending on stress and the crystal lattice structure modification such as FCC, BCC, or L10-type of crystals, where L10 is a type of crystal class which exhibits perpendicular magnetizations), can also determine the direction of magnetization.

Figure 3B:
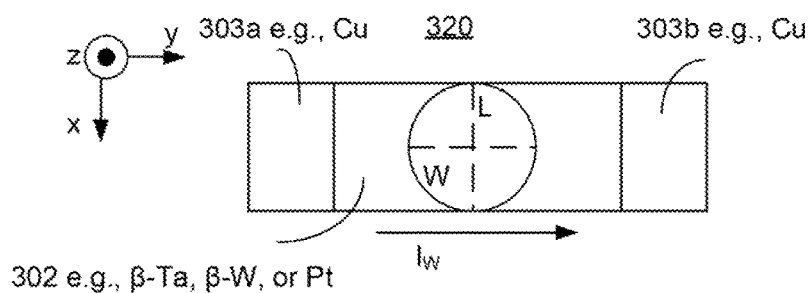
FIG. 3B illustrates a top view of the stack.

FIG. 3B illustrates top view 320 of the stack of FIG. 3A. It is pointed out that those elements of FIG. 3B having the same reference numbers (or names) as the elements of any other figure can operate or function in any manner similar to that described, but are not limited to such. Top view 320 shows that the magnet is oriented along the width of the SOE Interconnect 302 for appropriate spin injection.

In some embodiments, the magnetic cell is written by applying a charge current via the SOE (or SHE) Interconnect 302. The direction of the magnetic writing (in the free magnet layer) is decided by the direction of the applied charge current. Positive currents (i.e., currents flowing in the +y direction) produce a spin injection current with transport direction (along the +z direction) and spins pointing to the +x direction. The injected spin current in-turn produces spin torque to align the free magnet (coupled to the SOE material) in the +x or −x direction. The injected spin current $\vec{I}_s$ generated by a charge current $\vec{I}_c$ in the write electrode is given by:

$$\vec{I}_s = P_{SHE}(w,t,\lambda_{sf},\theta_{SHE})(\hat{z} \times \vec{I}_c)$$

where, the vector of spin current $\vec{I}_s = \vec{I}_\uparrow - \vec{I}_\downarrow$ is the difference of currents with spin along and opposite to the spin direction, $\hat{z}$ is the unit vector perpendicular to the interface, $P_{SHE}$ is the spin Hall injection efficiency which is the ratio of magnitude of transverse spin current to lateral charge current, w is the width of the magnet, t is the thickness of the SHE Interconnect 302, $\lambda_{sf}$ is the spin flip length in the SHE Interconnect 302, $\theta_{SHE}$ is the spin Hall angle for the SHE Interconnect 302 to free ferromagnetic layer interface. The injected spin angular momentum responsible for the spin torque given by: $\vec{S} = \hbar \vec{I}_s/2e$.

FIG. 4A illustrates non-volatile 1-bit XOR logic 400 formed with interconnects coupled to electrodes having SOE materials and a MTJ coupled between the electrodes, according to some embodiments of the disclosure. It is pointed out that those elements of FIG. 4A having the same reference numbers (or names) as the elements of any other figure can operate or function in any manner similar to that described, but are not limited to such.

In some embodiments, non-volatile 1-bit XOR logic 400 comprises First Layer 401 (also referred to as the First Electrode) formed of SOE material, Second Layer 402 (also referred to as the Second Electrode) formed of SOE material, MTJ 403 with dual free ferromagnetic layers, First Interconnect 404, Second Interconnect 405, Third Interconnect 406, Fourth Interconnect 407, Top Electrode 408, and Bottom Electrode 409. Here, each of First and Second Layers 401/402 are same in structure and function as SOE Interconnect 302 of FIG. 3A, and First and Third Interconnects 404 and 406 respectively (and Second and Fourth Interconnects 405 and 407 respectively) are same in structure and function as interconnect metal(s) 303a/b of FIG. 3A. Here, MTJ 403 has dual free ferromagnetic layers separated by a non-magnetic dielectric (e.g., MgO) while the example of FIG. 3A describes MTJ 301 having a fixed ferromagnetic layer and a free magnetic layer separated by a non-magnetic dielectric MgO. The dual free ferromagnetic layers are labeled as the First Free Magnet and the Second Free Magnet.

In some embodiments, the First Free Magnet of MTJ 403 is coupled to First layer 401 such that positive (i.e., +y) or negative (i.e., −y) currents driven as first input (i.e., Input-1) produce a spin injection current with transport direction in First layer 401. In some embodiments, the positive currents (i.e., currents flowing in the +y direction) provided as Input-1 to First Interconnect 404 produce a spin injection current with transport direction (along the −z direction) and spins pointing to the +x direction in First layer 401.

In some embodiments, the negative currents (i.e., currents flowing in the −y direction) provided as Input-1 to First Interconnect 404 produce a spin injection current with transport direction (along the −z direction) and spins pointing to the −x direction in First layer 401. In some embodiments, the injected spin current in-turn produces spin torque to align the First Free Magnet in the +x or −x directions. In some embodiments, Third Interconnect 406 is used to transfer the current injected as Input-1 to a downstream logic (e.g., another XOR logic or some other logic).

In some embodiments, the Second Free Magnet of MTJ 403 is coupled to Second layer 402 such that positive (i.e., +y) or negative (i.e., −y) currents driven as second input (i.e., Input-2) produce a spin injection current with transport direction in Second Layer 402. In some embodiments, the positive currents (i.e., currents flowing in the +y direction) provided as Input-2 to Second Interconnect 405 produce a spin injection current with transport direction (along the +z direction) and spins pointing to the −x direction in Second layer 402.

In some embodiments, the negative currents (i.e., currents flowing in the −y direction) provided as Input-2 to Second Interconnect 405 produce a spin injection current with transport direction (along the +z direction) and spins pointing to the +x direction in Second layer 402. In some embodiments, the injected spin current in-turn produces spin torque to align the Second Free Magnet of MTJ 403 in the +x or −x directions. In some embodiments, Fourth Interconnect 407 is used to transfer the current injected as Input-2 to a downstream logic (e.g., another XOR logic or some other logic).

In some embodiments, the charge currents flow in First and Second Interconnects 404 and 405, respectively, and the spin orbit effect in First and Second Layers (or electrodes) 401 and 402, respectively, leads to spin current injection into the First and Second Free Magnets respectively to the logic state calculation. The direction of the injected spins in the spin current is given by the cross product:

$$\vec{J}_s = \theta_{SHE}(\hat{z} \times \vec{J}_c)$$

where $\vec{J}_s$ is direction of spin current and $\vec{J}_c$ is direction of charge current.

In some embodiments, Bottom Electrode 409 is coupled to ground and Top Electrode 408 provides the Output which is determined by a current sensing circuit (not shown). In some embodiments, when charge currents flow in First and Second Interconnects 404 and 405, respectively, $I_{READ}$ (i.e., Output) is sensed and depending on the resistance sensed of XOR logic 400, the logic state of XOR logic is determined (i.e., angle of the two Free Magnet Layers can be read by sensing $I_{READ}$ which depends on whether the magnetization directions of First and Second Free Magnets are parallel (P) or anti-parallel (AP) relative to each other.

The functionality of dual free ferromagnetic layer SHE based XOR logic device 400 can be verified using a multi-physics simulation which treats the nanomagnets as single spin projections (or magnetic moments) and uses spin circuit theory to calculate the scalar voltage and vector spin voltages, according to one embodiment. The two free magnets of MTJ 403 are described by Landau-Lifshitz-Gilbert equations:

$$\frac{\partial m_1}{\partial t} = -\gamma\mu_0[m_1 \times \overline{H}_{eff}] + \alpha\left[m_1 \times \frac{\partial m_1}{\partial t}\right] - \frac{1}{eN_s}(m_1 \times (m_1 \times \vec{I}_{s1}))$$

$$\frac{\partial m_2}{\partial t} = -\gamma\mu_0[m_2 \times \overline{H}_{eff}] + \alpha\left[m_2 \times \frac{\partial m_2}{\partial t}\right] - \frac{1}{eN_s}(m_2 \times (m_2 \times \vec{I}_{s2}))$$

Here, $\vec{I}_{s1}$ and $\vec{I}_{s2}$ are the projections perpendicular to magnetizations of the spin polarized currents entering the two free nanomagnets—First and Second Free Magnet layers, respectively. These projections are derived from the spin-circuit analysis. The effective magnetic field $\vec{H}_{eff}$ originating from shape and material anisotropy, and the Gilbert damping constant 'α' are the properties of the magnets. The spin currents are obtained from a vector transport model for MTJ 403. Here, $m_1$ and $m_2$ are magnetization vectors of the First and Second Free Magnet layers, respectively, $N_s$ is the number of spins in each of the first and second free magnets. In some embodiments, the spin equivalent circuit comprises a tensor spin conduction matrix governed by the present conduction of the magnet. In one embodiment, a self-consistent stochastic solver is used to account for thermal noise of the magnets.

FIG. 4B illustrates top view 420 of non-volatile 1-bit XOR logic 400 of FIG. 4A, according to some embodiments of the disclosure. It is pointed out that those elements of FIG. 4B having the same reference numbers (or names) as the elements of any other figure can operate or function in any manner similar to that described, but are not limited to such. The direction of the injected spins in the spin current is given by the cross product:

$$\vec{J}_s = \theta_{SHE}(\hat{z} \times \vec{J}_c)$$

where $\vec{J}_s$ is direction of spin current and $\vec{J}_c$ is direction of charge current. In one example, there are two possible spin currents. One spin current is in the +z direction with spin polarized along the x axis, and another spin current is in the −z direction with spin polarized along the x axis.

FIGS. 5A-D illustrate operating modes 500, 520, 530, and 540 of non-volatile 1-bit XOR logic 400 of FIG. 4A, according to some embodiments of the disclosure. It is pointed out that those elements of FIGS. 5A-D having the same reference numbers (or names) as the elements of any other figure can operate or function in any manner similar to that described, but are not limited to such.

Figure 5A:
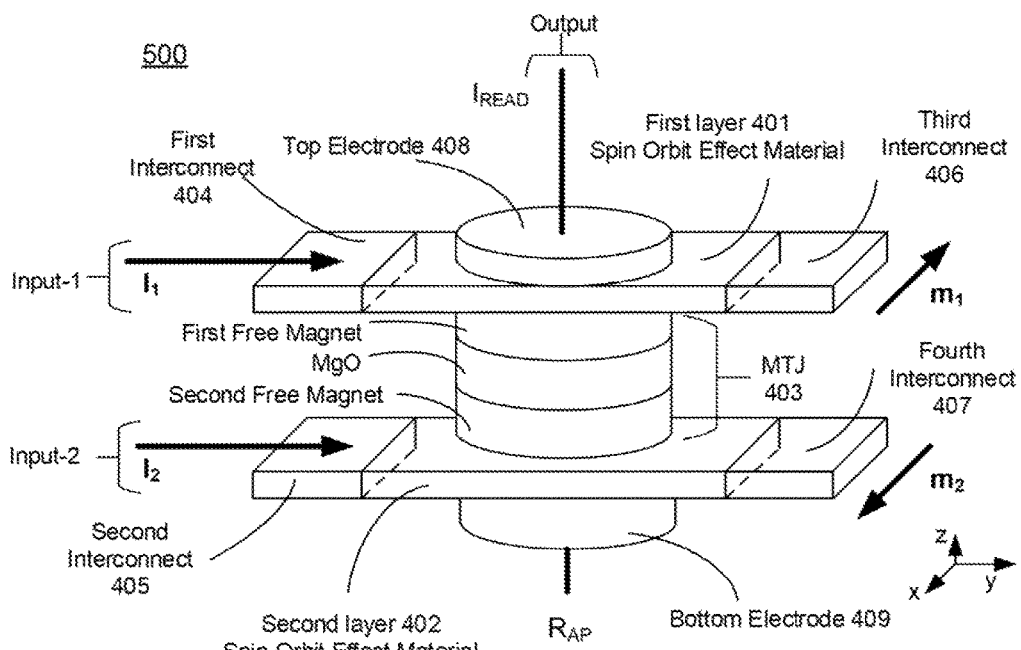
FIGS. 5A-D illustrate operating modes of the non-volatile 1-bit XOR logic of FIG. 4A, according to some embodiments of the disclosure.

FIG. 5A illustrates operating mode 500 when input currents $I_1$ and $I_2$ (i.e., Input-1 and Input-2, respectively) are positive currents (i.e., their direction of flow is towards +y axis) provided to First and Second Interconnects 404 and 405, respectively. These positive input currents are received by First and Second layers (401 and 402 respectively) of SOE material which inject spin currents in the free magnetic layers coupled to the respective First layer 401 and Second layer 402. In this case, the spin current injected into First layer 401 and Second layer 402 are opposite in spin polarization leading to an anti-parallel orientation of magnetizations in MTJ 403 (i.e., producing a higher resistance on the Output node). The anti-parallel orientation of MTJ 403 is indicated by magnetization directions $m_1$ and $m_2$, which are facing opposite directions. In some embodiments, the higher resistance (i.e., $R_{AP}$ from anti-parallel orientation of MTJ 403) sensed by the Output node indicates logic 0 while the positive input currents $I_1$ and $I_2$ indicate inputs of logic 1 each.

Figure 5B:
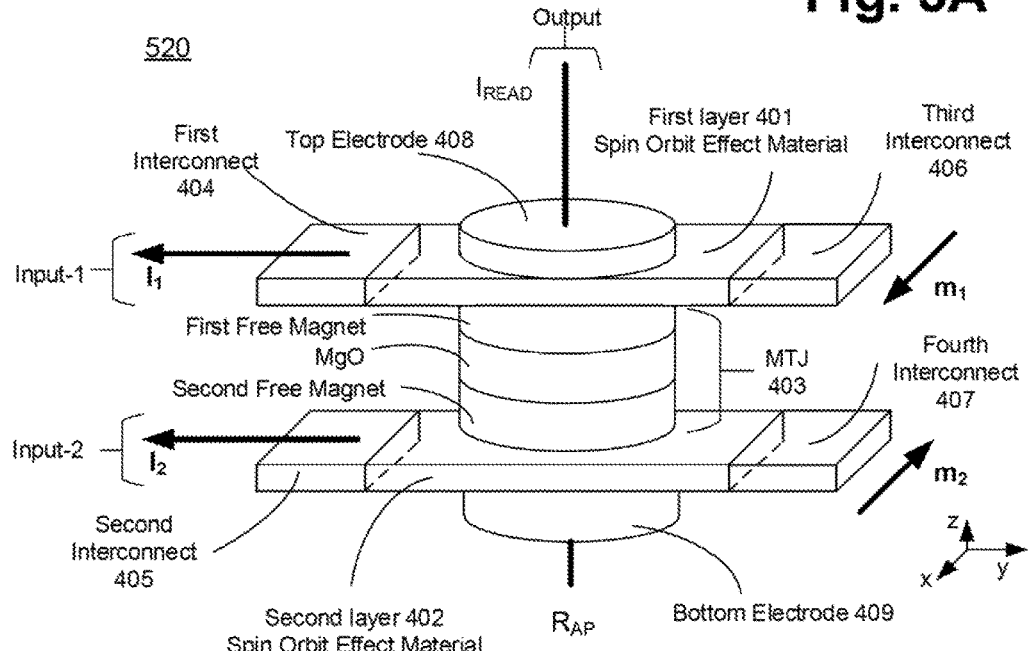

FIG. 5B illustrates operating mode 520 when input currents $I_1$ and $I_2$ (i.e., Input-1 and Input-2, respectively) are negative currents (i.e., their direction of flow is towards the −y axis) provided to First and Second Interconnects 404 and 405, respectively. These negative input currents are received by First and Second layers (401 and 402, respectively) which inject spin currents in the free magnetic layers coupled to the respective First layer 401 and Second layer 402.

In this case, the spin current injected into First layer 401 and Second layer 402 are opposite in spin polarization leading to an anti-parallel orientation of magnetizations in MTJ 403 (i.e., producing a higher resistance on the Output node). The anti-parallel orientation of MTJ 403 is indicated by magnetization directions $m_1$ and $m_2$, which are facing opposite directions like in operation mode 500 of FIG. 5A. In some embodiments, the higher resistance (i.e., $R_{AP}$) sensed by the Output node indicates logic 0 while the negative input currents $I_1$ and $I_2$ indicate inputs of logic 0 each.

Figure 5C:
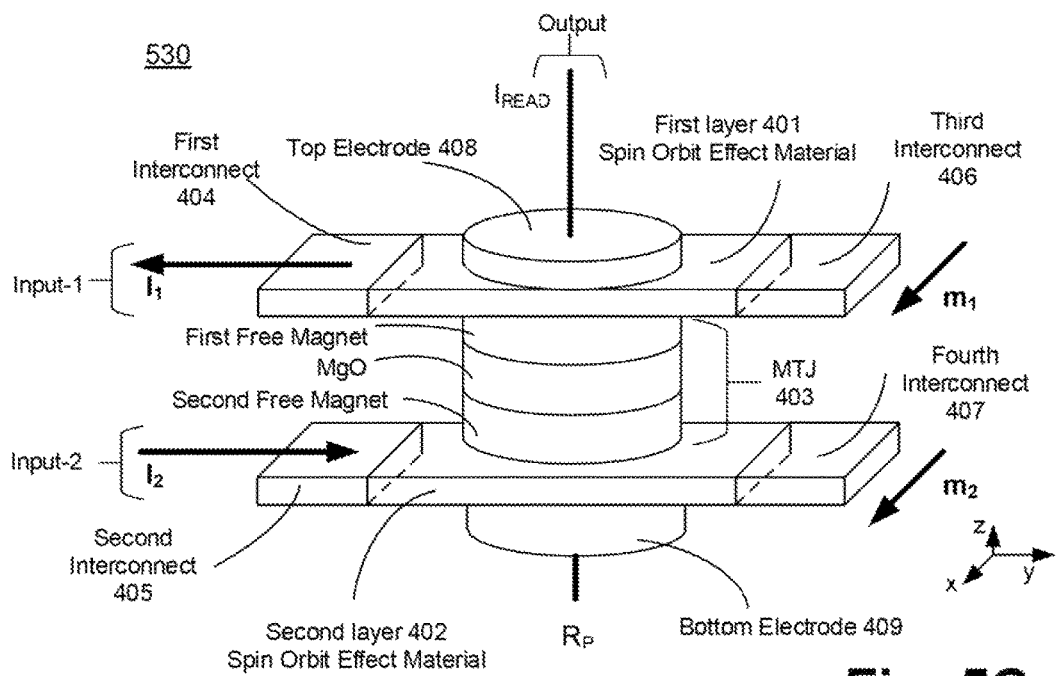

FIG. 5C illustrates operating mode 530 when input currents $I_1$ and $I_2$ (i.e., Input-1 and Input-2, respectively) are negative and positive currents, respectively. Here, $I_1$ flows in the −y direction while $I_2$ flows in the +y direction. Input currents $I_1$ and $I_2$ are provided to First and Second Interconnects 404 and 405, respectively. These negative and positive input currents are received by First and Second layers 401 and 402, respectively, which inject spin currents in the free magnetic layers coupled to the respective First layer 401 and Second layer 402.

In this case, the spin current injected into First layer 401 and Second layer 402 have the same spin polarization leading to parallel orientation of magnetizations in MTJ 403 (i.e., producing a lower resistance on the Output node). The parallel orientation of MTJ 403 is indicated by magnetization directions $m_1$ and $m_2$, which are facing the same directions. In some embodiments, the lower resistance (i.e., $R_P$ from parallel orientation of MTJ 403) sensed by the Output node indicates logic 1. In this case, the negative input current $I_1$ indicates an input of logic 0 and the positive input current $I_2$ indicates an input of logic 1.

Figure 5D:
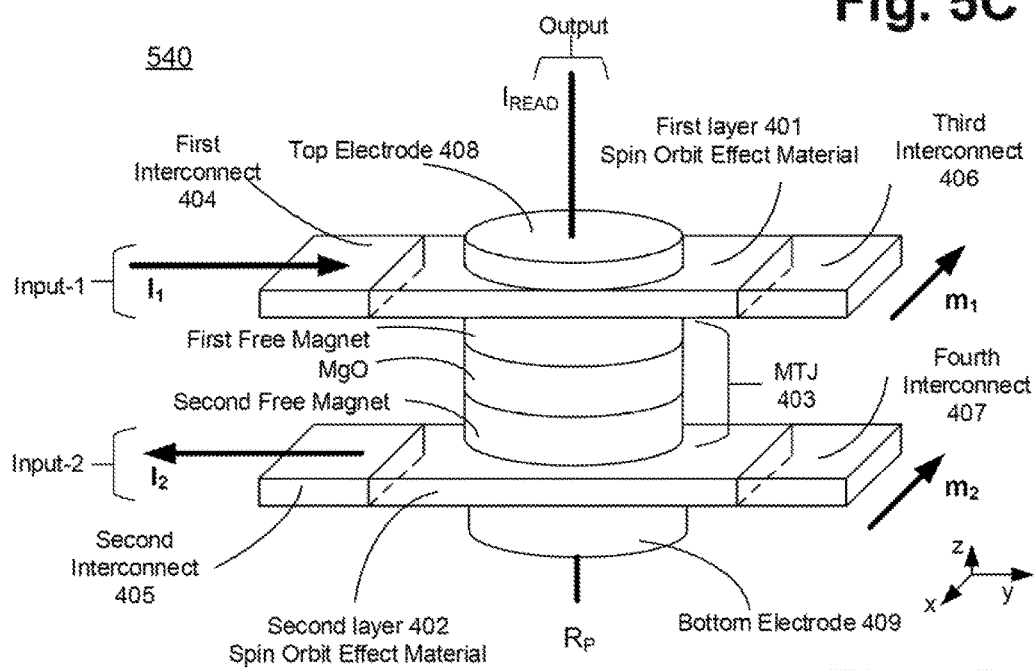

FIG. 5D illustrates operating mode 540 when input currents $I_1$ and $I_2$ (i.e., Input-1 and Input-2, respectively) are positive and negative currents, respectively. Here, $I_1$ flows in the +y direction while $I_2$ flows in the −y direction. Input currents $I_1$ and $I_2$ are provided to First and Second Interconnects 404 and 405, respectively. These positive and negative input currents are received by First and Second layers 401 and 402, respectively, which inject spin currents in the free magnetic layers coupled to the respective First layer 401 and Second layer 402.

In this case, the spin current injected into First layer 401 and Second layer 402 have the same spin polarization leading to parallel orientation of magnetizations in MTJ 403 (i.e., producing a lower resistance on the Output node). The parallel orientation of MTJ 403 is indicated by magnetization directions $m_1$ and $m_2$, which are facing the same directions. In some embodiments, the lower resistance (i.e., $R_P$) sensed by the Output node indicates logic 1. In this case, the positive input current $I_1$ indicates an input of logic 1 and the negative input current $I_2$ indicates an input of logic 0.

Table 1 summarizes the four operation modes of the non-volatile XOR logic, in accordance to some embodiments. Expressed in terms of resistance of the MTJ, $$R = R_{AP} - \Delta R \cdot \text{XOR}(I_1, I_2)$$

where the currents I designate their logical values, according to Table 1, and the difference of resistances $\Delta R = R_{AP} - R_P$. Resistance can be converted to voltage using a sense amplifier.

TABLE 1 non-volatile XOR logic truth table

| Input-1 (Current $I_1$) | Input-1 (Current $I_2$) | Output Resistance ($R_{out}$) |
|---|---|---|
| $I_1 > 0$ (i.e., Logic 1) | $I_2 > 0$ (i.e., Logic 1) | High $R_{AP}$ (i.e., logic 0) |
| $I_1 > 0$ (i.e., Logic 1) | $I_2 < 0$ (i.e., Logic 0) | Low $R_P$ (i.e., logic 1) |
| $I_1 < 0$ (i.e., Logic 0) | $I_2 < 0$ (i.e., Logic 0) | High $R_{AP}$ (i.e., logic 0) |
| $I_1 > 0$ (i.e., Logic 0) | $I_2 > 0$ (i.e., Logic 1) | Low $R_P$ (i.e., logic 1) |

Figure 6:
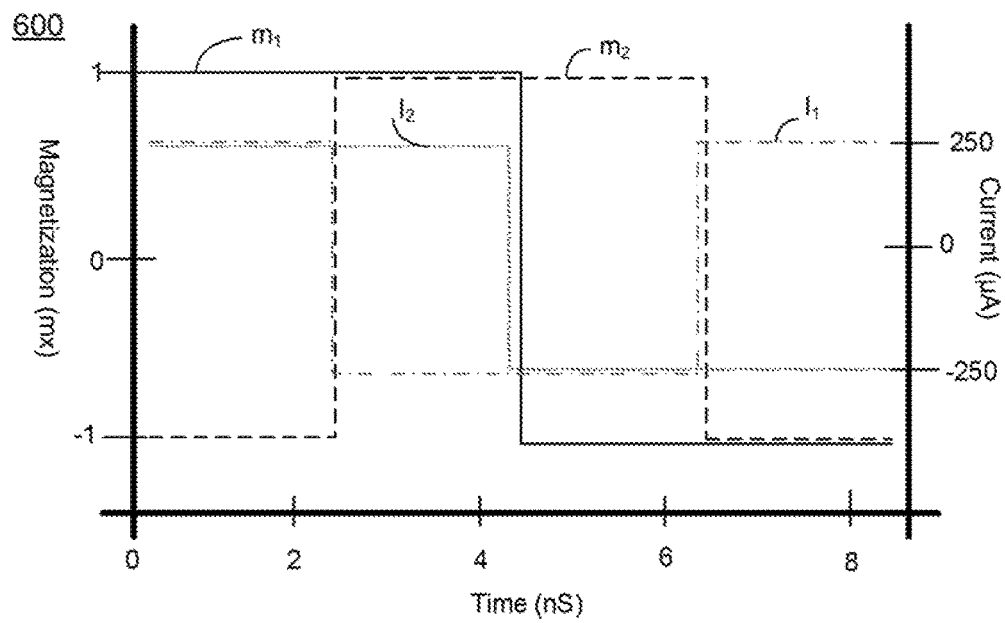
FIG. 6 illustrates a plot showing dynamic response of the non-volatile 1-bit XOR logic of FIG. 4A, according to some embodiments of the disclosure.

FIG. 6 illustrates plot 600 showing the dynamic response of non-volatile 1-bit XOR logic 400 of FIG. 4A, according to some embodiments of the disclosure. It is pointed out that those elements of FIG. 6 having the same reference numbers (or names) as the elements of any other figure can operate or function in any manner similar to that described, but are not limited to such. Here, x-axis is time in nanoseconds (nS), y-axis on the left side is magnetization (i.e., $m_1$, $m_2$), and y-axis on the right side is current in microamperes (μA). In some embodiments, the magnetization $m_1$ of the First Free Magnet of MTJ 403 follows input current $I_1$ while the magnetization $m_2$ of the Second Free Magnet of MTJ 403 follows input current $-I_2$.

Figure 7:
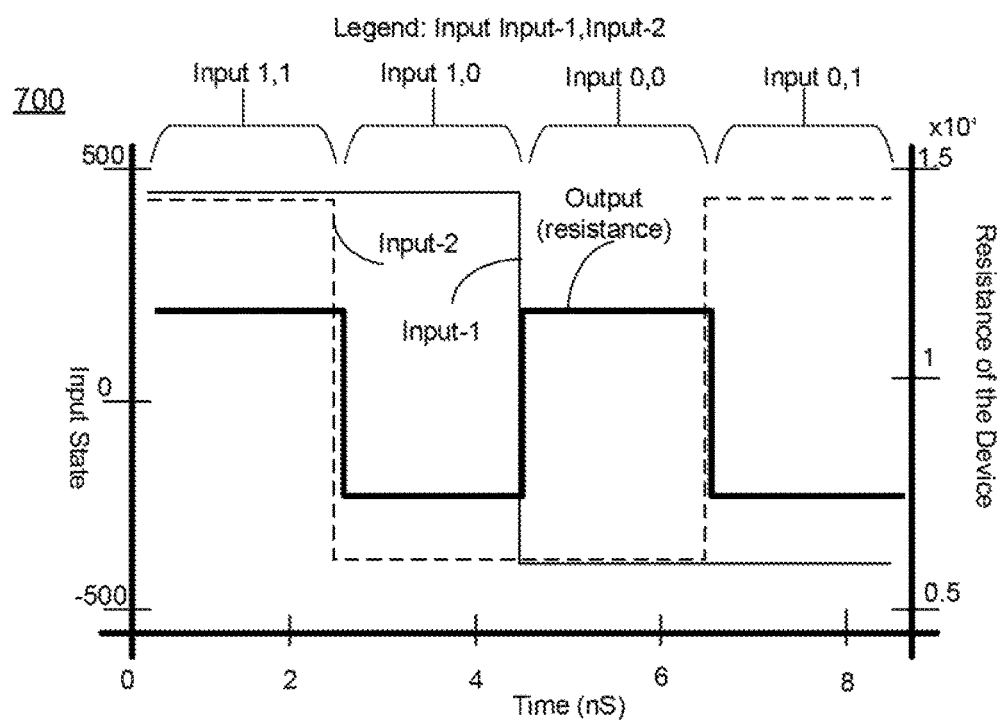
FIG. 7 illustrates a plot showing logic operation of the non-volatile 1-bit XOR logic of FIG. 4A, according to some embodiments of the disclosure.

FIG. 7 illustrates plot 700 showing logic operation of the non-volatile 1-bit XOR logic 400 of FIG. 4A, according to some embodiments of the disclosure. It is pointed out that those elements of FIG. 7 having the same reference numbers (or names) as the elements of any other figure can operate or function in any manner similar to that described, but are not limited to such. Here, x-axis is time nanoseconds (nS), y-axis on the left side is the input state, and y-axis on the right side is resistance of the device in Ohms.

In some embodiments, the spin current injected from Input-1 causes the switching of the First free magnetic layer of MTJ 403 to follow the logic stage of Input-1. In some embodiments, the spin current injected from Input-2 causes the switching of the Second free magnetic layer of MTJ 403 to follow the inverted logic state of Input-2. Here, the resistance of XOR logic 400 is modulated according to the exclusive-or logic as described with reference to Table 1.

Figure 8:
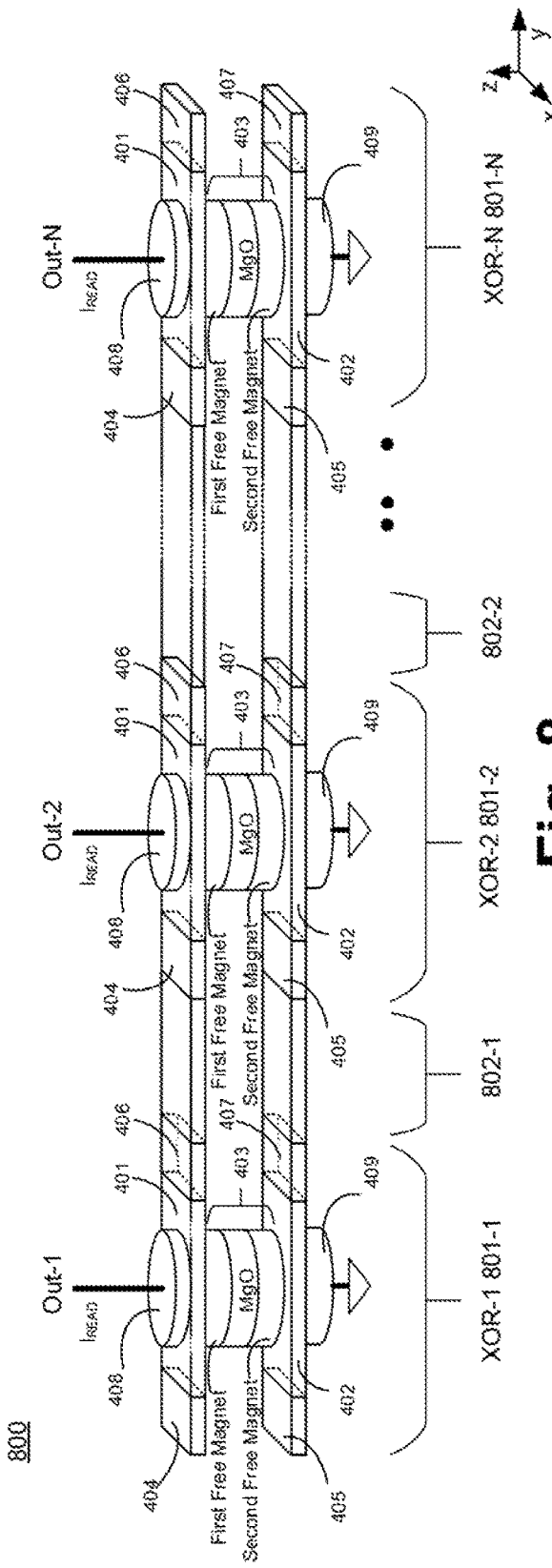
FIG. 8 illustrates logic with series coupled non-volatile 1-bit XOR logic units, according to some embodiments of the disclosure.

FIG. 8 illustrates logic 800 with series coupled non-volatile 1-bit XOR logic units, according to some embodiments of the disclosure. It is pointed out that those elements of FIG. 8 having the same reference numbers (or names) as the elements of any other figure can operate or function in any manner similar to that described, but are not limited to such.

In some embodiments, XOR logic 400 is serially cascaded with other XOR logic to form an array of XOR logic. In some embodiments, Input-1 and Input-2 are shared by all XOR logic devices coupled in series. Here, 'N' XOR logic devices are shown—XOR-1 801 through XOR-N 801-N, where 'N' an integer greater than 1. In some embodiments, non-magnetic conducting metal (e.g., 802-1, 802-2, etc.) are used for coupling the two SOE electrodes of each XOR logic.

For example, Third Interconnect 406 of XOR-1 801-1 is coupled to First Interconnect 404 of XOR-2 801-2, and Fourth Interconnect 407 of XOR-1 801-1 is coupled to Second Interconnect 405 of XOR-2 801-2. In some embodiments, the non-magnetic conducting metal is the same material as the First, Second, Third, and Fourth Interconnects. For example, the non-magnetic conducting metal is Cu.

Figure 9:
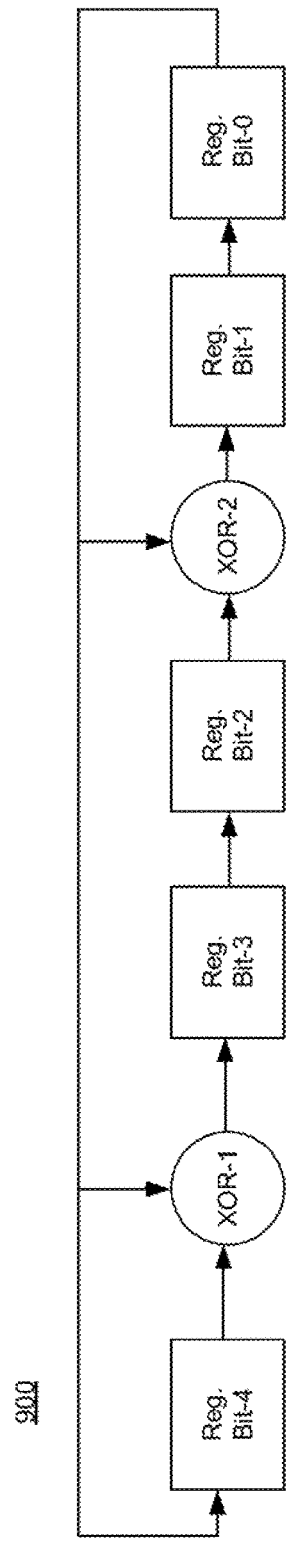
FIG. 9 illustrates a pseudorandom number generator implemented with non-volatile 1-bit XOR logic of FIG. 4A, according to some embodiments of the disclosure.

FIG. 9 illustrates pseudorandom number generator 900 using non-volatile 1-bit XOR logic units of FIG. 4A, according to some embodiments of the disclosure. It is pointed out that those elements of FIG. 9 having the same reference numbers (or names) as the elements of any other figure can operate or function in any manner similar to that described, but are not limited to such.

In some embodiments, XOR logic unit 400 can be used to implement a non-volatile pseudorandom number generator. In some embodiments, non-volatile magnetic XOR logic (such as XOR logic 400) with stochastic switching (which provides randomness) is combined with traditional linear feedback shift registers to form a pseudorandom number generator. In some embodiments, pseudorandom number generator 900 comprises linear shift registers (Reg.)—Reg. Bit-0, Reg. Bit-1, Reg. Bit-4, and Reg. Bit-3 coupled together as shown. Fewer of more registers may be coupled to form a feedback shift register chain with XOR logic (e.g., XOR-1 and XOR-2) embedded between them. In some embodiments, non-volatile magnetic XOR logic with high magnetic thermal noise can be used to improve the randomness of the bits.

Figure 10:
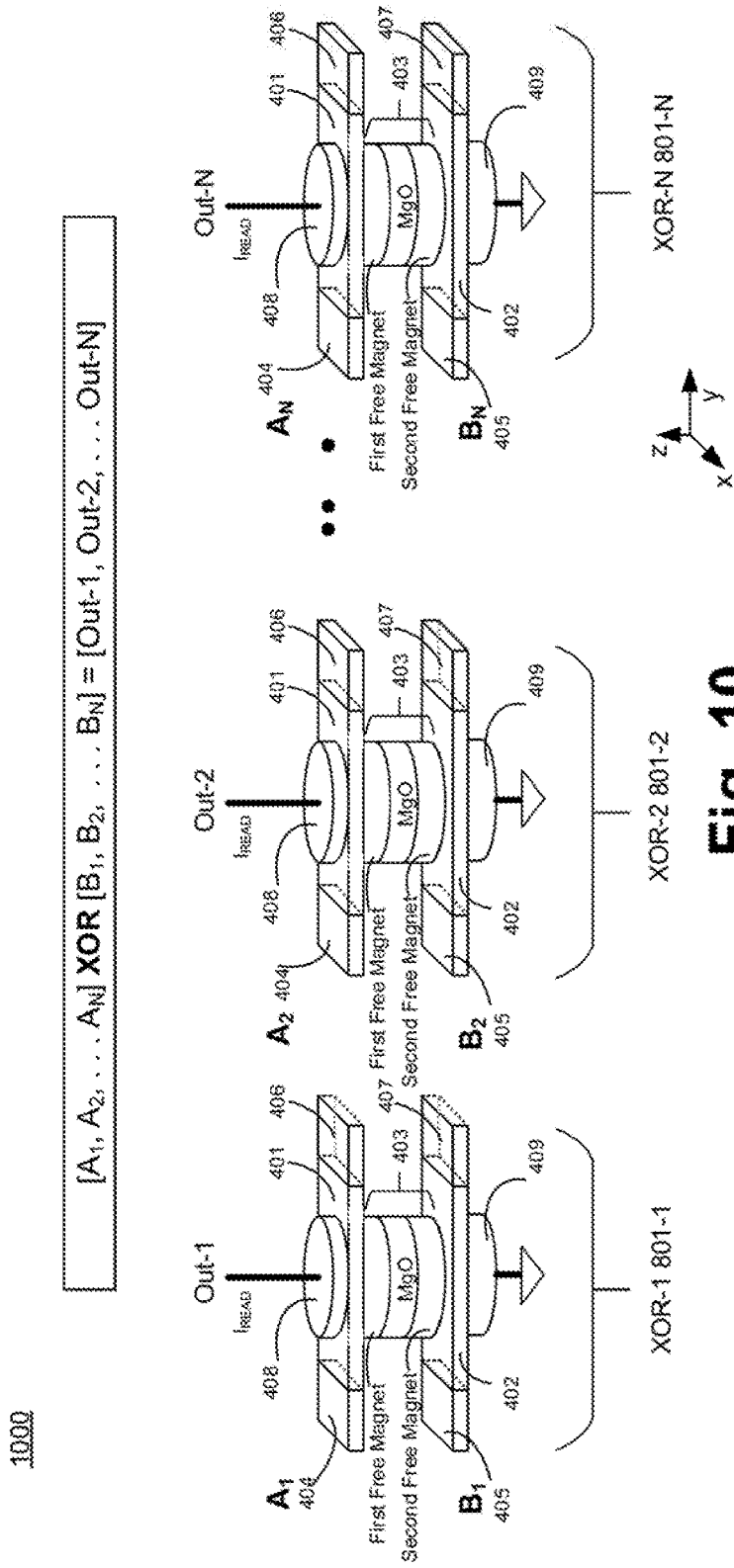
FIG. 10 illustrates bit-wise comparator implemented with non-volatile XOR logic of FIG. 4A for comparing two words, according to some embodiments of the disclosure.

FIG. 10 illustrates bit-wise comparator 1000 using non-volatile XOR logic devices of FIG. 4A for comparing two words, according to some embodiments of the disclosure. It is pointed out that those elements of FIG. 10 having the same reference numbers (or names) as the elements of any other figure can operate or function in any manner similar to that described, but are not limited to such.

In some embodiments, instead of coupling XOR logic devices XOR-1 801 through XOR-N 801-N in series, the XOR logic devices are arranged such that each input terminal of the XOR logic compares two bits of different words. For example, XOR-1 801-1 performs bit-wise XOR operation between bits $A_1$ and $B_1$, XOR-2 801-2 performs bit-wise XOR operation between bits $A_2$ and $B_2$, and XOR-N 801-N performs XOR operation between bit $A_N$ and $B_N$, where [$A_1$, $A_2$, ... $A_N$] is a first 'N' bit word, [$B_1$, $B_2$, ... $B_N$] is a second 'N' bit word, and Out-1 through Out-N is the 'N' bit output. In some embodiments, the bit values of the two words are currents provided as inputs. For example, $A_1$=1 refers to positive input current flowing in +y direction, and $A_1$=0 refers to negative input current flowing in −y direction.

Figure 11:
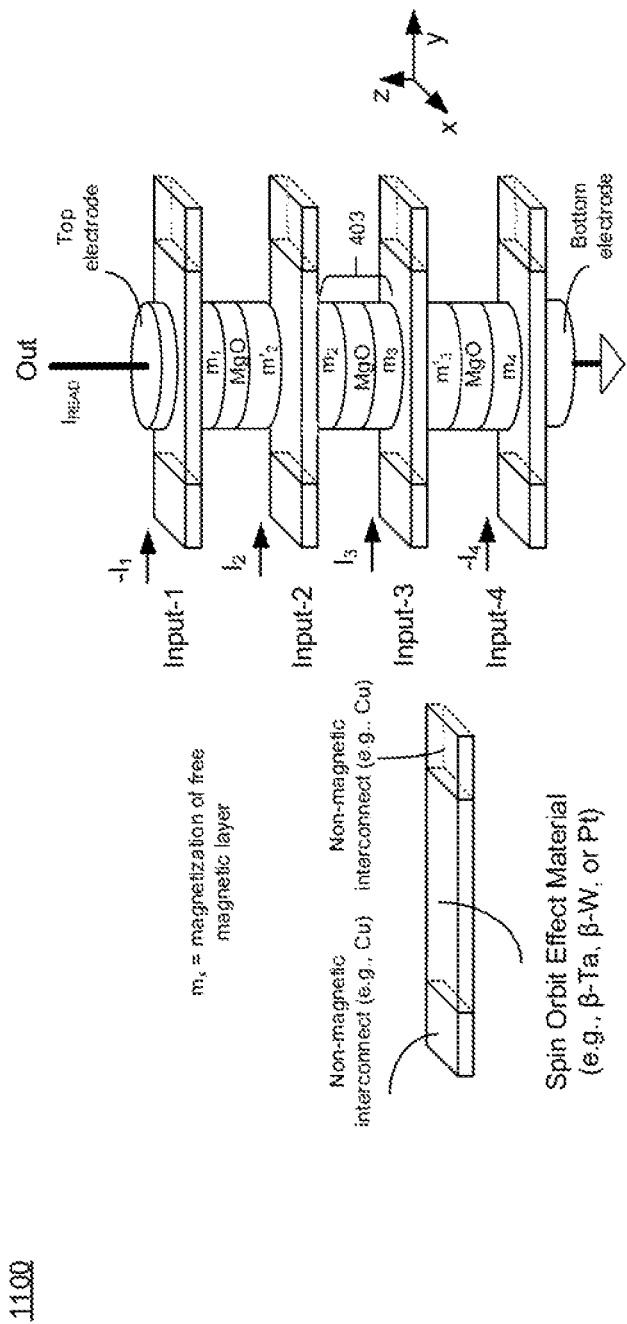
FIG. 11 illustrates a classifier using non-volatile XOR logic, according to some embodiments of the disclosure.

FIG. 11 illustrates classifier 1100 formed with non-volatile XOR logic, according to some embodiments of the disclosure. It is pointed out that those elements of FIG. 11 having the same reference numbers (or names) as the elements of any other figure can operate or function in any manner similar to that described, but are not limited to such.

In some embodiments, XOR logic can be vertically cascaded as shown to form a multi-input and single output classifier. In this example, a four input classifier is shown where each input includes a SOE electrode coupled to a non-magnetic metal to receive the input current. The output Out depends on the effective resistance of the vertical stack which in turn depends on the direction of currents on the input ports (Input-1 through Input-4).

In this example, four free magnetic layers are coupled between SOE electrodes. In some embodiments, the SOE electrode that receives Input-4 is coupled to free magnet having magnetization $m_4$. In some embodiments, the SOE electrode that receives Input-3 is coupled to free magnets having magnetization $m_3$ and $m'_3$ respectively. In some embodiments, the SOE electrode that receives Input-2 is coupled to free magnets having magnetization $m_2$ and $m'_2$, respectively. In some embodiments, the SOE electrode that receives Input-1 is coupled to free magnet having magnetization $m_1$. In some embodiments, the Bottom electrode is grounded and coupled to the SOE electrode that receives Input-4 while the Top electrode provides the output Out and is coupled to the SOE electrode that receives Input-1.

In some embodiments, the direction of magnetization $m_1$ of the free magnet follows input current $-I_1$, the magnetization $m_2$ of the free magnet follows input current $I_2$ and the direction of magnetization $m'_2$ is opposite to that of $m_2$, the magnetization $m_3$ of the free magnet follows input current $I_3$ and the direction of magnetization $m'3$ is opposite to that of $m_3$, and the magnetization $m_4$ of the free magnet follows input current $-I_4$.

The resistance of the stack depends on the magnetization of all magnetic layers and is combination of three MTJs in series. It represents a multiple logic level value which implements the logic function of the sum of nearest-neighbor XORs.

$$R=R_{AP}-\Delta R \cdot XOR(-I_1,-I_2)+R_{AP}-\Delta R \cdot XOR(I_2,I_3)+R_{AP}-\Delta R \cdot XOR(-I_3,-I_4)=3R_{AP}-R_{12}(XOR(I_1,I_2)+XOR(I_2,I_3)+XOR(I_3,I_4))$$

In another embodiment, stacked magnets switched by SOE perform a different logic function of inputs depending on the direction of input currents and geometry of nanomagnets and tunneling barriers.

Figure 12:
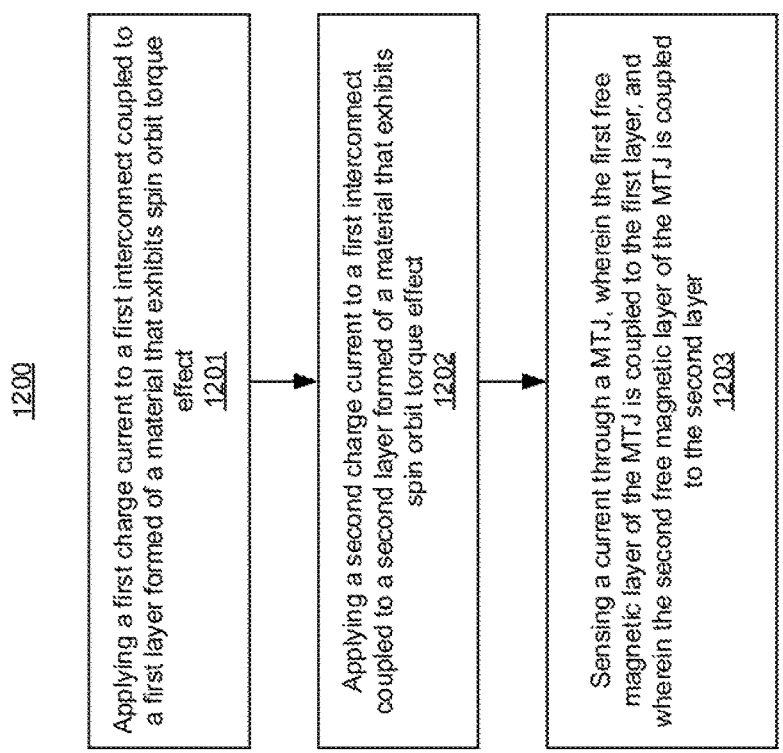
FIG. 12 illustrates a flowchart of a method for operating the non-volatile XOR logic of FIG. 4A, according to some embodiments of the disclosure.

FIG. 12 illustrates flowchart 1200 of a method for operating the non-volatile XOR logic of FIG. 4A, according to some embodiments of the disclosure. It is pointed out that those elements of FIG. 12 having the same reference numbers (or names) as the elements of any other figure can operate or function in any manner similar to that described, but are not limited to such.

Although the blocks in the flowchart with reference to FIG. 12 are shown in a particular order, the order of the actions can be modified. Thus, the illustrated embodiments can be performed in a different order, and some actions/blocks may be performed in parallel. Some of the blocks and/or operations listed in FIG. 12 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 1201, a first charge current $I_1$ is applied to First Interconnect 404 coupled to First layer 401 formed of SOE material. This current causes the SOE material to inject spin current in the First Free Magnet of MTJ 403. At block 1202, a second charge current $I_2$ is applied to Second Interconnect 405 coupled to Second layer 402 formed of SOE material. This current causes the SOE material to inject spin current in the Second Free Magnet of MTJ 403. At block 1203, $I_{READ}$ is sensed by a sensing circuit coupled to the output Out. Depending on the direction of the first and second charge currents, $I_{READ}$ indicates a high resistance or low resistance through XOR logic 400, where the high and low resistances map to output logic states of XOR logic 400 as described with reference to Table 1.

Figure 13:
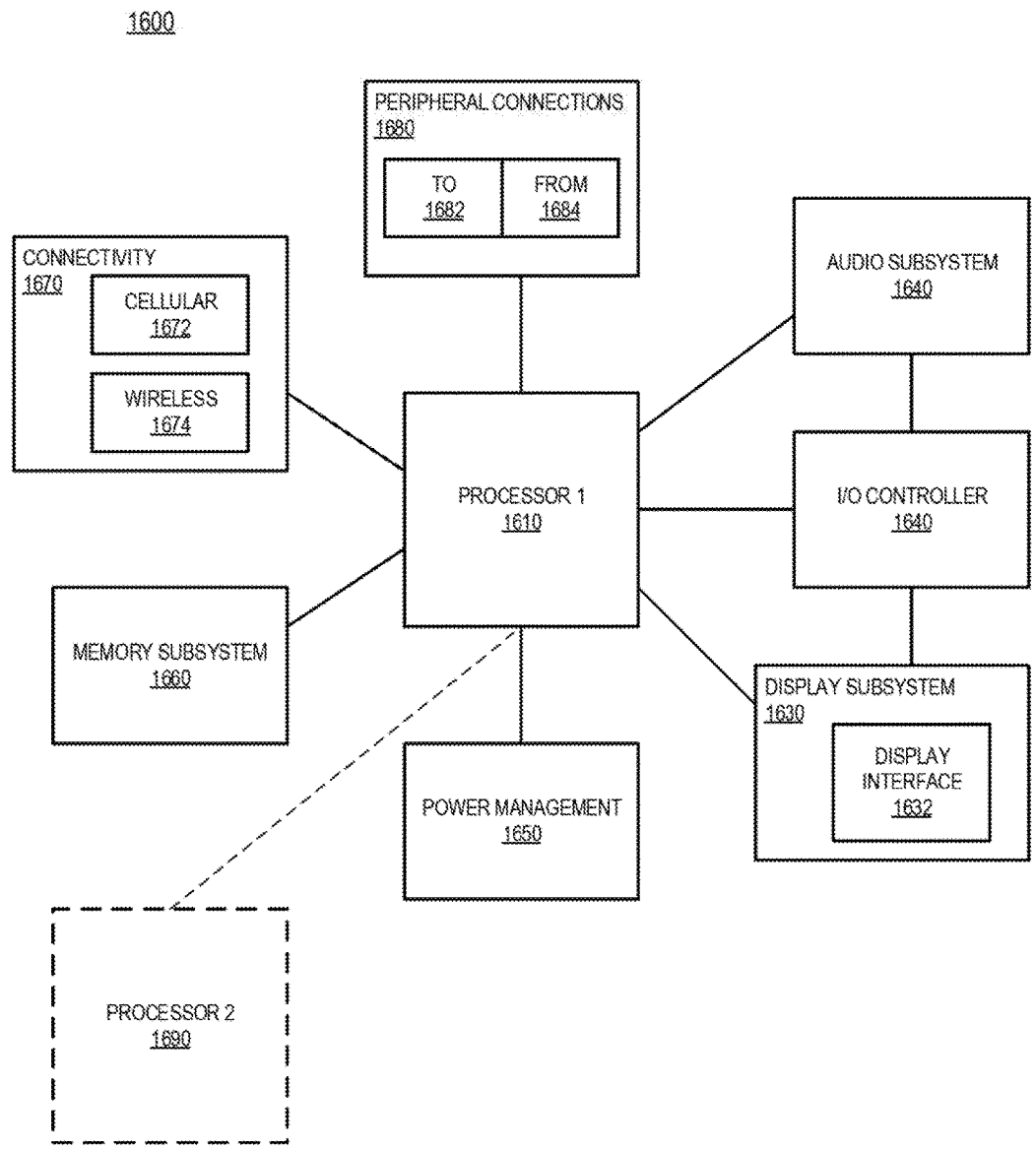
FIG. 13 illustrates a smart device or a computer system or a SoC (System-on-Chip) with non-volatile XOR logic of FIG. 4A and/or applications implemented with non-volatile XOR logic, according to some embodiments.

FIG. 13 illustrates a smart device or a computer system or a SoC (System-on-Chip) 1600 with non-volatile XOR logic of FIG. 4A and/or its various applications (such as comparator, pseudorandom generator, and classifier), according to some embodiments. It is pointed out that those elements of FIG. 13 having the same reference numbers (or names) as the elements of any other figure can operate or function in any manner similar to that described, but are not limited to such.

FIG. 13 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with non-volatile XOR logic of FIG. 4A and/or its various applications, according to some embodiments discussed. Other blocks of the computing device 1600 may also include non-volatile XOR logic of FIG. 4A and/or its various applications, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a first layer formed of a material that exhibits spin orbit torque effect; a second layer formed of material that exhibits spin orbit torque effect; and a magnetic tunneling junction (MTJ) including first and second free magnetic layers, wherein the first free magnetic layer is coupled to the first layer and wherein the second free magnetic layer is coupled to the second layer. In some embodiments, the apparatus comprises a first interconnect, formed of non-magnetic material, coupled to the first layer, wherein the first interconnect to provide a first input. In some embodiments, the apparatus comprises a second interconnect, formed of non-magnetic material, coupled to the second layer, wherein the second interconnect to provide a second input.

In some embodiments, the apparatus comprises a first electrode coupled to the first layer. In some embodiments, the first electrode is an output electrode coupled to a sensing apparatus. In some embodiments, the apparatus comprises a second electrode coupled to the second layer. In some embodiments, the first and second inputs to provide positive currents flowing towards the first and second layers to cause direction of spin current in the first free magnetic layer to be opposite to direction of spin current in the second free magnetic layer. In some embodiments, the first and second inputs to provide negative currents flowing away from the first and second layers to cause direction of spin current in the first free magnetic layer to be opposite to direction of spin current in the second free magnetic layer.

In some embodiments, the first and second inputs to provide currents flowing in different directions with respect to each other to cause direction of spin current in the first free magnetic layer to be same as direction of spin current in the second free magnetic layer. In some embodiments, the MTJ includes an insulator layer coupled to the at least two free magnetic layers. In some embodiments, the first and second layers and the MTJ together provide an exclusive-OR logic function. In some embodiments, the material that exhibits spin orbit torque effect is a Spin Hall Effect (SHE) material. In some embodiments, the SHE material is formed from one or more of: W, Ta, Pt, CuIr, 4d or 5d metals with high spin orbit coupling.

In another example, a method is provided which comprises: applying a first charge current to a first interconnect coupled to a first layer formed of a material that exhibits spin orbit torque effect; applying a second charge current to a second interconnect coupled to a second layer formed of a material that exhibits spin orbit torque effect; and sensing a current through a magnetic tunneling junction (MTJ) including first and second free magnetic layers, wherein the first free magnetic layer is coupled to the first layer and wherein the second free magnetic layer is coupled to the second layer.

In some embodiments, applying the first and second charge currents comprises: flowing the first and second charge currents in the first and second layers respectively such that the first and second charge currents flow in different directions with respect to each other to cause direction of spin current in the first free magnetic layer to be the same as direction of spin current in the second free magnetic layer. In some embodiments, applying the first and second charge currents comprises flowing the first and second charge currents towards the first and second layers respectively to cause direction of spin current in the first free magnetic layer to be opposite to direction of spin current in the second free magnetic layer. In some embodiments, applying the first and second charge currents comprises flowing the first and second charge currents away from the first and second layers respectively to cause direction of spin current in the first free magnetic layer to be opposite to direction of spin current in the second free magnetic layer.

In another example, a system is provided which comprises: a memory; a processor coupled to the memory, the processor includes an exclusive-OR (XOR) logic comprising an apparatus to the apparatus described above; and a wireless interface for allowing the processor to communicate with another device.

In another example, an apparatus is provided which comprises: means for applying a first charge current to a first interconnect coupled to a first layer formed of a material that exhibits spin orbit torque effect; means for applying a second charge current to a second interconnect coupled to a second layer formed of a material that exhibits spin orbit torque effect; and means for sensing a current through a magnetic tunneling junction (MTJ) including first and second free magnetic layers, wherein the first free magnetic layer is coupled to the first layer and wherein the second free magnetic layer is coupled to the second layer.

In some embodiments, the means for applying the first and second charge currents comprises: means for flowing the first and second charge currents in the first and second layers respectively such that the first and second charge currents flow in different directions with respect to each other to cause direction of spin current in the first free magnetic layer to be the same as direction of spin current in the second free magnetic layer. In some embodiments, means for applying the first and second charge currents comprises: means for flowing the first and second charge currents towards the first and second layers respectively to cause direction of spin current in the first free magnetic layer to be opposite to direction of spin current in the second free magnetic layer. In some embodiments, the means for applying the first and second charge currents comprises: means for flowing the first and second charge currents away from the first and second layers respectively to cause direction of spin current in the first free magnetic layer to be opposite to direction of spin current in the second free magnetic layer.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first layer including spin orbit material;

a second layer including spin orbit material;
a magnetic junction including:
   a third layer comprising a free magnet; and
   a fourth layer comprising a free magnet, wherein the third layer is adjacent to the first layer, and wherein the fourth layer is adjacent to the second layer;
a first interconnect comprising a non-magnetic material, wherein the first interconnect is coupled to the first layer, wherein the first interconnect is to provide a first input; and
a second interconnect comprising a non-magnetic material, wherein the second interconnect is coupled to the second layer, and wherein the second interconnect is to provide a second input.

2. The apparatus of claim 1 comprising a first electrode coupled to the first layer.

3. The apparatus of claim 2, wherein the first electrode is an output electrode coupled to a sensing apparatus.

4. The apparatus of claim 2 comprising a second electrode coupled to the second layer.

5. The apparatus of claim 4, wherein the first and second inputs are to provide positive currents that flow towards the first and second layers to cause direction of spin current in the third layer to be opposite in direction of spin current in the fourth layer.

6. The apparatus of claim 4, wherein the first and second inputs are to provide negative currents that flow away from the first and second layers to cause direction of spin current in the third layer to be opposite to direction of spin current in the fourth layer.

7. The apparatus of claim 4, wherein the first and second inputs are to provide currents that flow in different directions with respect to each other to cause direction of spin current in the third layer to be same as direction of spin current in the fourth layer.

8. The apparatus of claim 1, wherein the magnetic junction includes a fifth layer coupled to the third and fourth layers.

9. The apparatus of claim 1, wherein the first and second layers and the magnetic junction together provide an exclusive-OR logic function.

10. The apparatus of claim 1, wherein the spin orbit material comprises a Spin Hall Effect (SHE) material.

11. The apparatus of claim 10, wherein the SHE material includes one or more of: W, Ta, Pt, Cu, Ir, 4d or 5d metals.

12. A method comprising:
applying a first charge current to a first interconnect coupled to a first layer comprising a material that exhibits spin orbit coupling effect;
applying a second charge current to a second interconnect coupled to a second layer comprising a material that exhibits spin orbit coupling effect; and
sensing a current through a magnetic junction including third and fourth layers comprising free magnets, wherein the third layer is coupled to the first layer and wherein the fourth layer is coupled to the second layer.

13. The method of claim 12, wherein applying the first and second charge currents comprises:
flowing the first and second charge currents in the first and second layers, respectively, such that the first and second charge currents flow in different directions with respect to each other to cause direction of spin current in the third layer to be the same as direction of spin current in the fourth layer.

14. The method of claim 12, wherein applying the first and second charge currents comprises flowing the first and second charge currents towards the first and second layers, respectively, to cause direction of spin current in the third layer to be opposite to direction of spin current in the fourth layer.

15. The method of claim 12, wherein applying the first and second charge currents comprises flowing the first and second charge currents away from the first and second layers, respectively, to cause direction of spin current in the third layer to be opposite to direction of spin current in the fourth layer.

16. A system comprising:
a memory;
a processor coupled to the memory, the processor includes an exclusive-OR (XOR) logic comprising:
   a first layer including a spin orbit material;
   a second layer including spin orbit material;
   a magnetic junction including third and fourth layers comprising free magnets, wherein the third layer is coupled to the first layer, and wherein the fourth layer is coupled to the second layer;
   a first interconnect comprising a non-magnetic material, wherein the first interconnect is coupled to the first layer, and wherein the first interconnect to provide a first input; and
   a second interconnect comprising a non-magnetic material, wherein the second interconnect is coupled to the second layer, and wherein the second interconnect to provide a second input; and
a wireless interface to allow the processor to communicate with another device.

17. The system of claim 16, wherein direction of currents through the first and second inputs determines direction of spin currents in the third and fourth layers.

* * * * *